US008377209B2

(12) United States Patent
White

(10) Patent No.: US 8,377,209 B2
(45) Date of Patent: Feb. 19, 2013

(54) LINEAR PLASMA SOURCE FOR DYNAMIC (MOVING SUBSTRATE) PLASMA PROCESSING

(75) Inventor: John M. White, Hayward, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1029 days.

(21) Appl. No.: 12/370,389

(22) Filed: Feb. 12, 2009

(65) Prior Publication Data

US 2009/0233387 A1    Sep. 17, 2009

Related U.S. Application Data

(60) Provisional application No. 61/036,031, filed on Mar. 12, 2008.

(51) Int. Cl.
*C23C 16/00*    (2006.01)
(52) U.S. Cl. ............... 118/718; 118/723 I; 118/723 IR; 118/723 E; 118/723 ER
(58) Field of Classification Search .................. None
See application file for complete search history.

(56) References Cited

U.S. PATENT DOCUMENTS

| | | | |
|---|---|---|---|
| 5,998,933 A * | 12/1999 | Shun'ko ............... | 315/111.51 |
| 6,367,411 B2 * | 4/2002 | Ogawa et al. ......... | 118/723 MW |
| 6,410,449 B1 | 6/2002 | Hanawa et al. | |
| 2003/0189403 A1 | 10/2003 | Yamada et al. | |
| 2005/0181535 A1 | 8/2005 | Yun et al. | |
| 2006/0027329 A1 | 2/2006 | Sinha et al. | |
| 2010/0028238 A1 | 2/2010 | Maschwitz | |

FOREIGN PATENT DOCUMENTS

| | | |
|---|---|---|
| KR | 1020070010989 | 1/2007 |
| KR | 10200700944412 | 9/2007 |

OTHER PUBLICATIONS

Akedo, "Fabrication of OLEDs on Epoxy Substrates with SiNx/CNx:H Multi-Layer Barrier Films" IDW '04, pp. 1367-1370.
Akedo, "LP-5: Late-News Poster: Plasma-CVD SiNx / Plasma-Polymerized CNx: H Multi-Layer Passivation Films for Organic Light Emitting Diodes" SID 03 Digest, pp. 559-561.
Search report and written opinion for PCT/US09/034262 issued Feb. 17, 2009.
Akedo, "Fabrication of OLEDs on Epoxy Substrates with SiNx/CNx:H Multi-Layer Barrier Films" IDW '04, pp. 1367-1370, 2004.
Akedo, "LP-5: Late-News Poster: Plasma-CVD SiNx / Plasma-Polymerized CNx: H Multi-Layer Passivation Films for Organic Light Emitting Diodes" SID 03 Digest, pp. 559-561, 2003.

* cited by examiner

*Primary Examiner* — Robert Xu
(74) *Attorney, Agent, or Firm* — Patterson & Sheridan, LLP

(57) ABSTRACT

The present invention generally relates to a method and apparatus for depositing a layer onto a substrate as the substrate is moving through the processing chamber. The substrate may move along a roll to roll system. A roll to roll system is a system where a substrate may be unwound from a first roll so that the substrate may undergo processing and then re-wound onto a second roll after the processing. As the substrate moves through the processing chamber, a plasma source may produce a plasma. An electrical bias applied to the substrate may draw the plasma to the substrate and hence, permit deposition of material onto the substrate as the substrate moves through the chamber.

8 Claims, 5 Drawing Sheets

LINEAR PLASMA SOURCE FOR DYNAMIC (MOVING SUBSTRATE) PLASMA PROCESSING

CROSS-REFERENCE TO RELATED APPLICATIONS

This application claims benefit of U.S. Provisional Patent Application Ser. No. 61/036,031 (APPM/12811L), filed Mar. 12, 2008, which is herein incorporated by reference.

BACKGROUND OF THE INVENTION

1. Field of the Invention

Embodiments of the present invention generally relate to a roll to roll processing apparatus for organic light emitting diode (OLED) manufacturing.

2. Description of the Related Art

OLED displays have gained significant interest recently in display applications in view of their faster response times, larger viewing angles, higher contrast, lighter weight, lower power, and amenability to flexible substrates, as compared to liquid crystal displays (LCD). In addition to organic materials used in OLEDs, many polymer materials are also developed for small molecule, flexible organic light emitting diode (FOLED) and polymer light emitting diode (PLED) displays. Many of these organic and polymer materials are flexible for the fabrication of complex, multi-layer devices on a range of substrates, making them ideal for various transparent multi color display applications, such as thin flat panel display (FPD), electrically pumped organic laser, and organic optical amplifier.

Over the years, layers in display devices have evolved into multiple layers with each layer serving a different function. Depositing multiple layers onto multiple substrates may require multiple processing chambers. Transferring multiple substrates through multiple processing chambers may decrease substrate throughput. Therefore, there is a need in the art for an efficient method and apparatus for processing OLED structures to ensure substrate throughput is maximized and substrate transferring is decreased.

SUMMARY OF THE INVENTION

The present invention generally relates to a method and apparatus for depositing a layer onto a substrate as the substrate is moving through the processing chamber. The substrate may move along a roll to roll system. A roll to roll system is a system where a substrate may be unwound from a first roll so that the substrate may undergo processing and then be re-wound onto a second roll after the processing. As the substrate moves through the processing chamber, a plasma source may produce a plasma. An electrical bias applied to the substrate may draw the plasma to the substrate and hence, permit deposition of material onto the substrate as the substrate moves through the chamber.

In one embodiment, apparatus includes a substrate processing chamber having a plurality of walls and one or more rotatable process drums disposed within the chamber. The apparatus also includes a plurality of filler blocks disposed within the substrate processing chamber and spaced thereapart to permit a substrate to pass therebetween while the substrate passes through the substrate processing chamber. The apparatus also includes one or more mu-plasma sources coupled with the processing chamber.

In another embodiment, a web-processing apparatus comprises a substrate processing chamber and one or more mu-plasma sources coupled with the processing chamber and capable of igniting a substantially linear plasma.

In another embodiment, a web-processing method includes moving a substrate through a processing chamber on a roll-to-roll substrate transfer system. The processing chamber has a plurality of filler blocks that are spaced apart to permit the substrate to move therebetween. The method also includes applying an electrical bias to a mu-plasma source to ignite a substantially linear plasma remote from the substrate. The substantially linear plasma is substantially perpendicular to the direction of the substrate movement. The method also includes applying an electrical bias to the substrate and drawing the plasma to the substrate and depositing a layer on the substrate as the substrate is moving through the chamber.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present invention generally relates to a method and apparatus for depositing a layer onto a substrate as the substrate is moving through the processing chamber. The substrate may move along a roll to roll system. A roll to roll system is a system where a substrate may be unwound from a first roll so that the substrate may undergo processing and then re-wound onto a second roll after the processing. As the substrate moves through the processing chamber, a plasma source may produce a plasma. An electrical bias applied to the substrate may draw the plasma to the substrate and hence, permit deposition of material onto the substrate as the substrate moves through the chamber.

Figure 1:
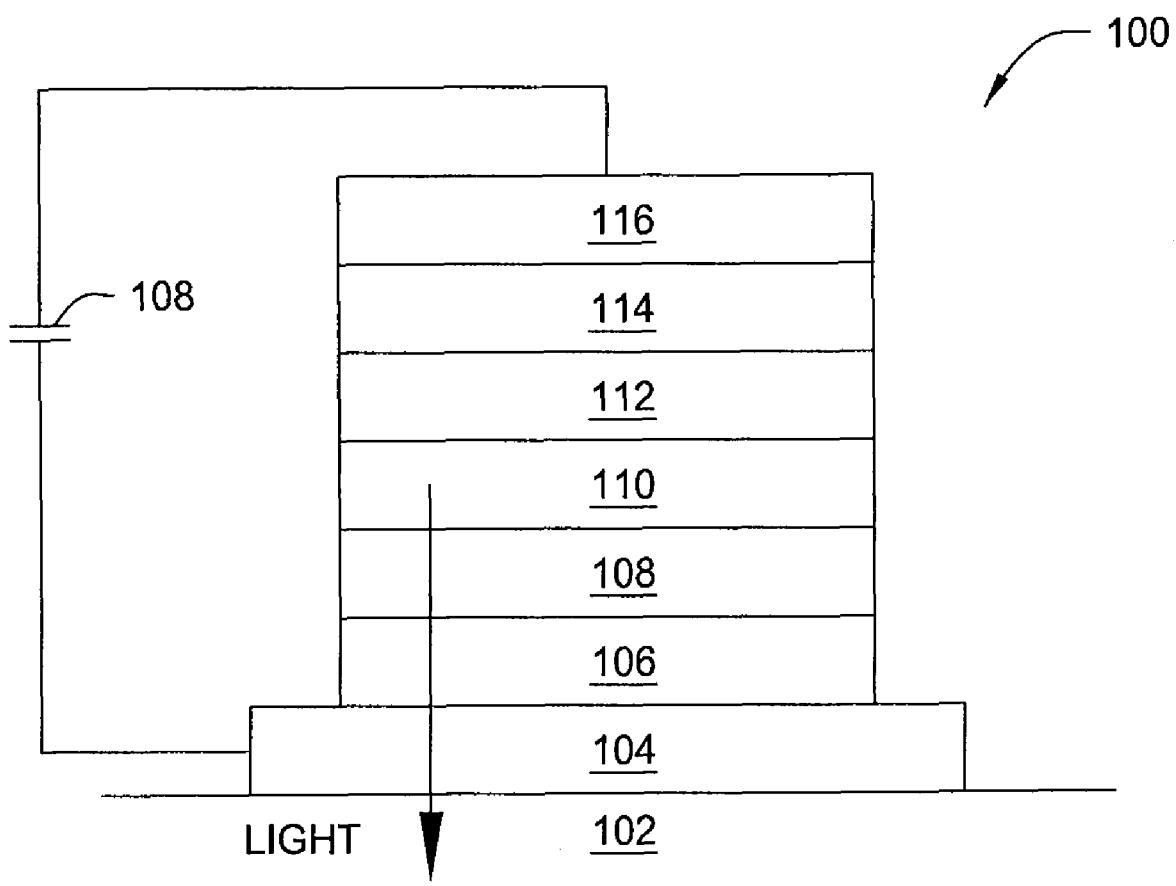
FIG. 1 is an OLED structure 100 according to one embodiment of the invention.

FIG. 1 is an OLED structure 100 according to one embodiment of the invention. The structure 100 comprises a substrate 102. In one embodiment, the substrate 102 is a flexible, roll to roll substrate. It is to be understood that while the substrate 102 is described as a roll to roll substrate, other substrates may be utilized to produce OLEDs including soda lime glass substrates, silicon substrates, semiconductor wafers, polygonal substrates, large area substrates, and flat panel display substrates.

Over the substrate 102, an anode 104 may be deposited. In one embodiment, the anode 104 may comprise a metal such as chromium, copper, or aluminum. In another embodiment, the anode 104 may comprise a transparent material such as zinc oxide, indium-tin oxide, etc. The anode 104 may have a thickness between about 200 Angstroms and about 2000 Angstroms.

A hole injection layer 106 may then be deposited over the anode 104. The hole injection layer 106 may have a thickness between about 200 Angstroms and about 2000 Angstroms. In one embodiment, the hole injection layer 106 may comprise a material having a straight chain oligomer having a phenylenediamine structure. In another embodiment, the hole injection layer 106 may comprise a material having a branched chain oligomer having a phenylenediamine structure.

A hole transport layer 108 may be deposited over the hole injection layer 106. The hole transport layer 108 may have a thickness between about 200 Angstroms to about 1000 Angstroms. The hole transport layer 108 may comprise a diamine. In one embodiment, the hole transport layer 108 comprises a naphthyl-substituted benzidine (NPB) derivative. In another embodiment, the hole transport layer 108 comprises N,N'-diphenyl-N,N'-bis(3-methylphenyl)-(1,1'-biphenyl)-4,4'-diamine (TPD).

An emissive layer 110 may be deposited over the hole transport layer 108. The emissive layer 110 may be deposited to a thickness between about 200 Angstroms to about 1500 Angstroms. Materials for the emissive layer 110 typically belong to a class of fluorescent metal chelated complexes. In one embodiment, the emissive layer comprises 8-hydroxyquinoline aluminum ($Alq_3$).

An electron transport layer 112 may be deposited over the emissive layer 110. The electron transport layer 112 may comprise metal chelated oxinoid compounds. In one embodiment, the electron transport layer 112 may comprise chelates of oxine itself (also commonly referred to as 8-quinolinol or 8-hydroxyquinoline). The electron transport layer 112 may have a thickness between about 200 Angstroms to about 1000 Angstroms.

An electron injection layer 114 may be deposited over the electron transport layer 112. The electron injection layer 114 may have a thickness between about 200 Angstroms to about 1000 Angstroms. The electron injection layer 114 may comprise a mixture of aluminum and at least one alkali halide or at least one alkaline earth halide. The alkali halides may be selected from the group consisting of lithium fluoride, sodium fluoride, potassium fluoride, rubidium fluoride, and cesium fluoride, and suitable alkaline earth halides are magnesium fluoride, calcium fluoride, strontium fluoride, and barium fluoride.

A cathode 116 may be deposited over the electron injection layer 114. The cathode 116 may comprise a metal, a mixture of metals, or an alloy of metals. In one embodiment, the cathode 116 may comprise an alloy of magnesium (Mg), silver (Ag), and aluminum (Al). The cathode 116 may have a thickness between about 1000 Angstroms and about 3000 Angstroms. An electrical bias may be supplied to the OLED structure 100 by a power source 118 such that light will be emitted and viewable through the substrate 102. The organic layers of the OLED structure 100 comprise the hole injection layer 106, the hole transport layer 108, the emissive layer 110, the electron transport layer 112, and the electron injection layer 114. It should be noted that not all five layers of organic layers are needed to build an OLED structure. For example, in some cases, only the hole transport layer 108 and the emissive layer 110 are needed.

It is to be understood that while the apparatus and method have been described in terms of an OLED structure, the apparatus and method may be used to produce any web-processed device. For example, the web-processing apparatus and method may be used to make flexible printed circuit boards (FPCBs), transparent top electrodes for displays, flexible solar cells, flexible displays, touch screens, flat panel displays, field emitter displays, cathode ray tubes, window films, winded film capacitors, and other devices on flexible substrates.

Figure 2A:
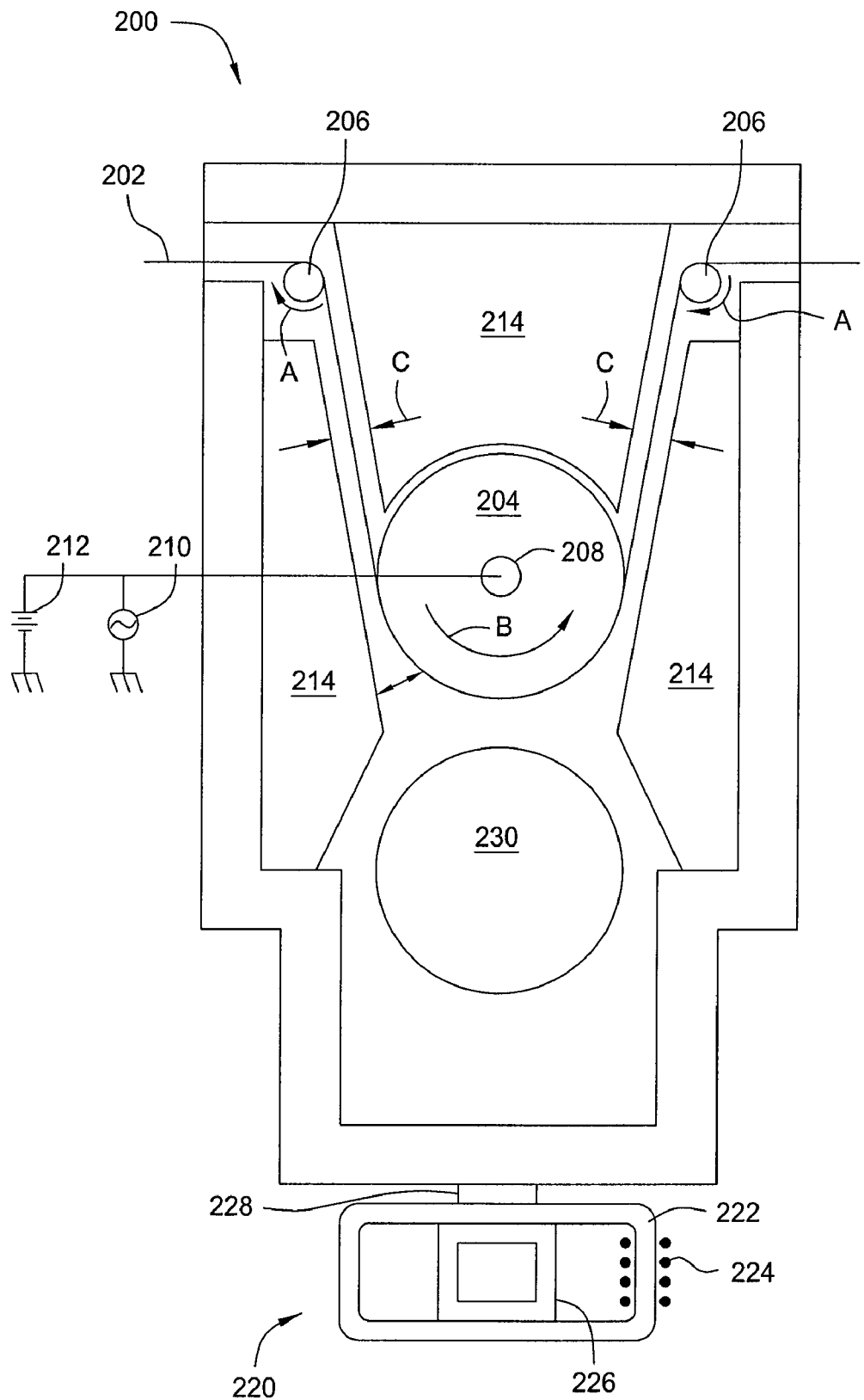
FIG. 2A is a cross sectional view of a processing chamber 200 according to one embodiment of the invention.
Figure 2B:
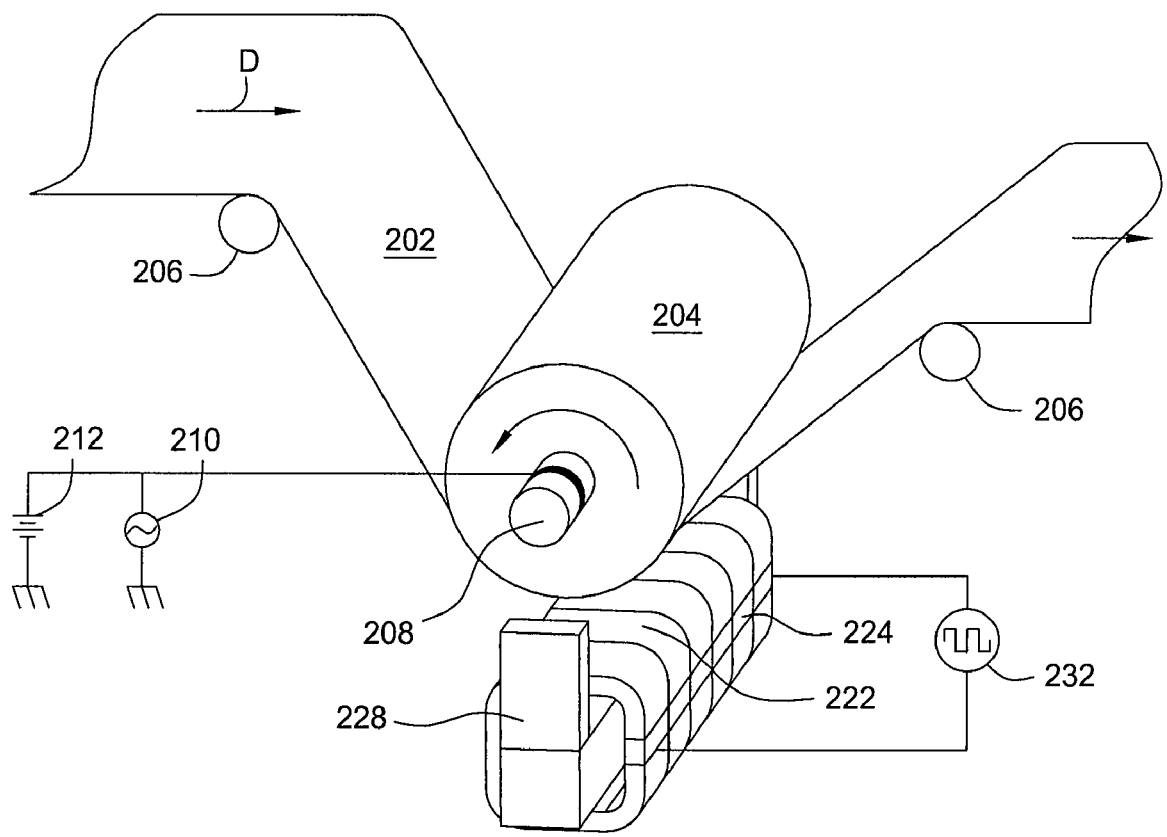
FIG. 2B is a perspective view of the processing chamber 200 of FIG. 2A with the chamber walls and filler 214 removed for clarity.

FIG. 2A is a cross sectional view of a processing chamber 200 according to one embodiment. FIG. 2B is a perspective view of the processing chamber 200 of FIG. 2A with the chamber walls and some filler 214 removed for clarity. A substrate 202 traveling along a roll to roll system enters the chamber 200 through a first side and over a roller 206 that rotates in a first direction as shown by arrow A. The substrate 202 is directed downward by a drum 204 that is rotating about an axel 208 in a direction shown by arrow B that is opposite to the first direction. The substrate 202 then rolls upward and over another roller 206 before leaving the chamber 200.

A plasma source may be used to deposit a layer on the substrate as it passes through the chamber. In one embodiment, the plasma source may comprise a mu-source 220. The mu-source may comprise one or more ferrite rings 222 encircling a plasma tube 226. One or more electrically biased coils 224 may be wrapped around the ferrite rings 222 and coupled to a power source 232. The power source 232 may comprise an AC, DC, or switched-DC power source. The coils 224 may comprise a multi-turn coil. The mu-source 222 has a plurality of arms 228 that extend to the chamber 200. The plasma 230 may be ignited within the tube 226 and between the two arms 228 within the processing chamber 200. The plasma 230 may be a linear plasma that extends between the arms 228. Because the plasma 230 is linear, unwanted deposition on chamber walls may be reduced.

The drum 204 may also be electrically biased by a power source 210, 212 which may be an AC, DC, or switched-DC power source. The electrical bias to the drum 204 provides an electrical bias to the substrate 202 as it moves along the outside surface of the drum 204. The electrical bias to the drum 204 draws the plasma 230 to the substrate 202 to deposit a layer on the substrate 202 as it rotates around the drum 204.

By igniting the plasma 230 remote from the substrate 202, the electrical bias on the substrate 202 may pull the plasma 230 to the substrate 202 to deposit a layer on the substrate 202. Thus, the magnitude of the electrical bias on the substrate 202 may determine the amount of plasma 230 drawn to the substrate 202 and hence, the rate that material is deposited on the substrate 202. The magnitude of the electrical bias on the substrate 202 may alter the film properties.

To minimize any unwanted deposition within the processing chamber 200, filler 214 material may be placed in the open areas of the chamber 200. The filler 214 may be spaced from the substrate 202 as it is moving through the chamber 200 by a distance shown by arrows C. In one embodiment, the distance between the filler 214 and the substrate 202 may be less than the dark space of the plasma. In one embodiment, the distance may be less than about 30 mm. In another embodiment, the distance may be less than about 10 mm. In another embodiment, the distance may be about 2 mm. In one embodiment, the fillers 214 may comprise a dielectric material. In another embodiment, the fillers 214 may comprise metal. The drum 204 and the filler 214 collectively may comprise about 90 percent of the processing chamber volume. The filler 214 may not block the line of sight path between the mu-source 220 and the substrate 202. The filler 214 may be used to confine the plasma 230 within certain, predetermined areas of the chamber 200 and reduce parasitic plasma formation.

Figure 3:
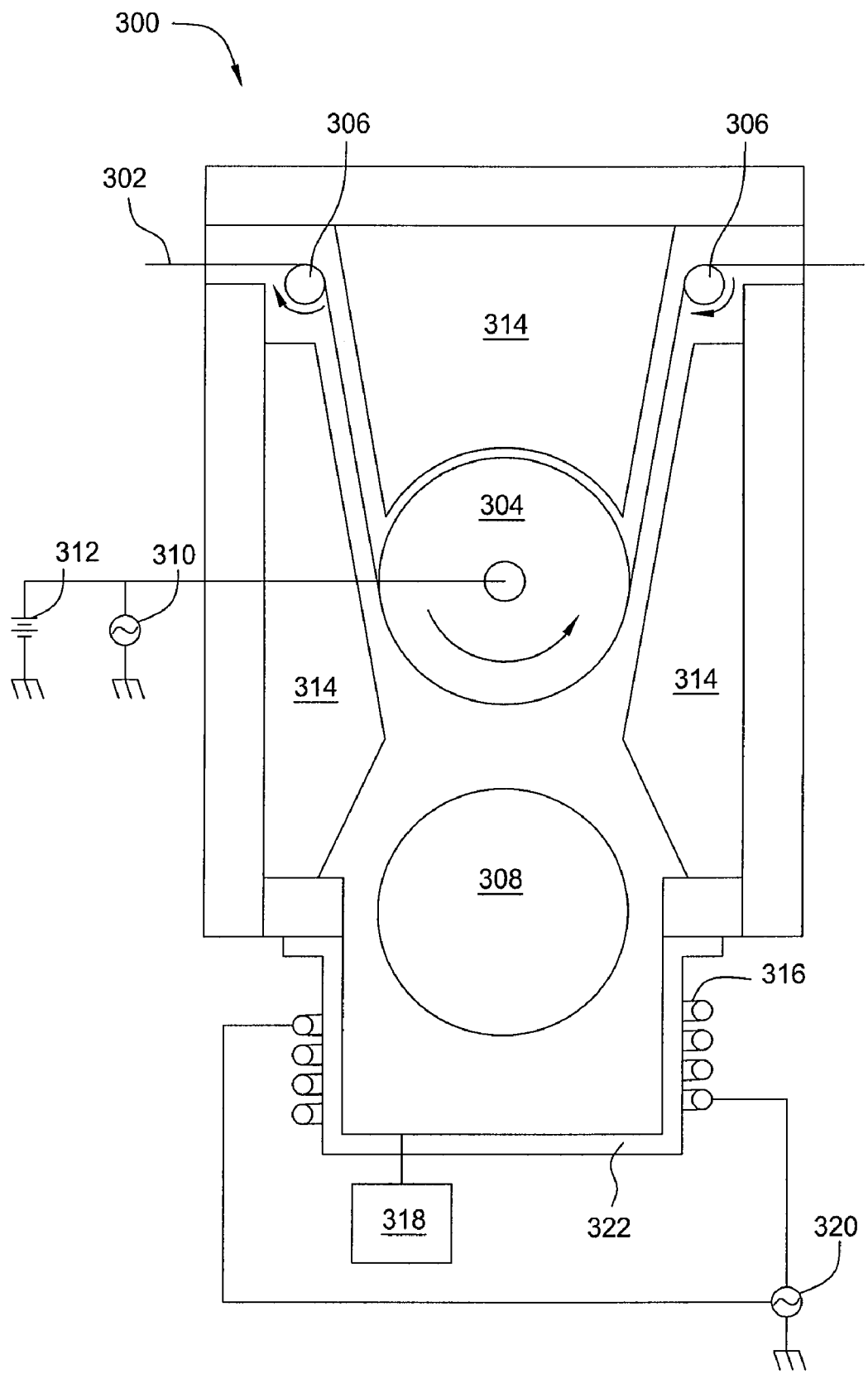
FIG. 3 is a cross sectional view of a processing chamber 300 according to another embodiment of the invention.

FIG. 3 is a cross sectional view of a processing chamber 300 according to another embodiment of the invention. The substrate 302 enters the chamber 300 and passes over one or more rollers 306. The substrate 302 also passes along the outside surface of a drum 304 that is rotating in a direction opposite to the rollers 306. The drum 304 may be electrically biased by power supplied from one or more power sources 310, 312. The power sources 310, 312 may be DC, AC, or switched-DC. Similar to the embodiment discussed above, filler 314 may be disposed into the processing chamber 300. For the plasma source, a coil 316 may be inductively coupled to the chamber 300. The coil 316 may be coupled to an RF power source 320 for an RF or switched-DC current to flow along the coil 316. Processing gas may be introduced from a processing gas source 318. The electrically biased coil 316 may ignite the processing gas into a plasma 308 that may be drawn to the substrate 302 for deposition. While the coil 316 has been shown inside the processing chamber 300, it is to be understood that the coil 316 could be coupled to the chamber 300 from outside the chamber 300 through a dielectric window 322. The electrical bias on the substrate 302 at the drum 304 may pull the plasma 308 to the substrate 302 for deposition.

Figure 4A:
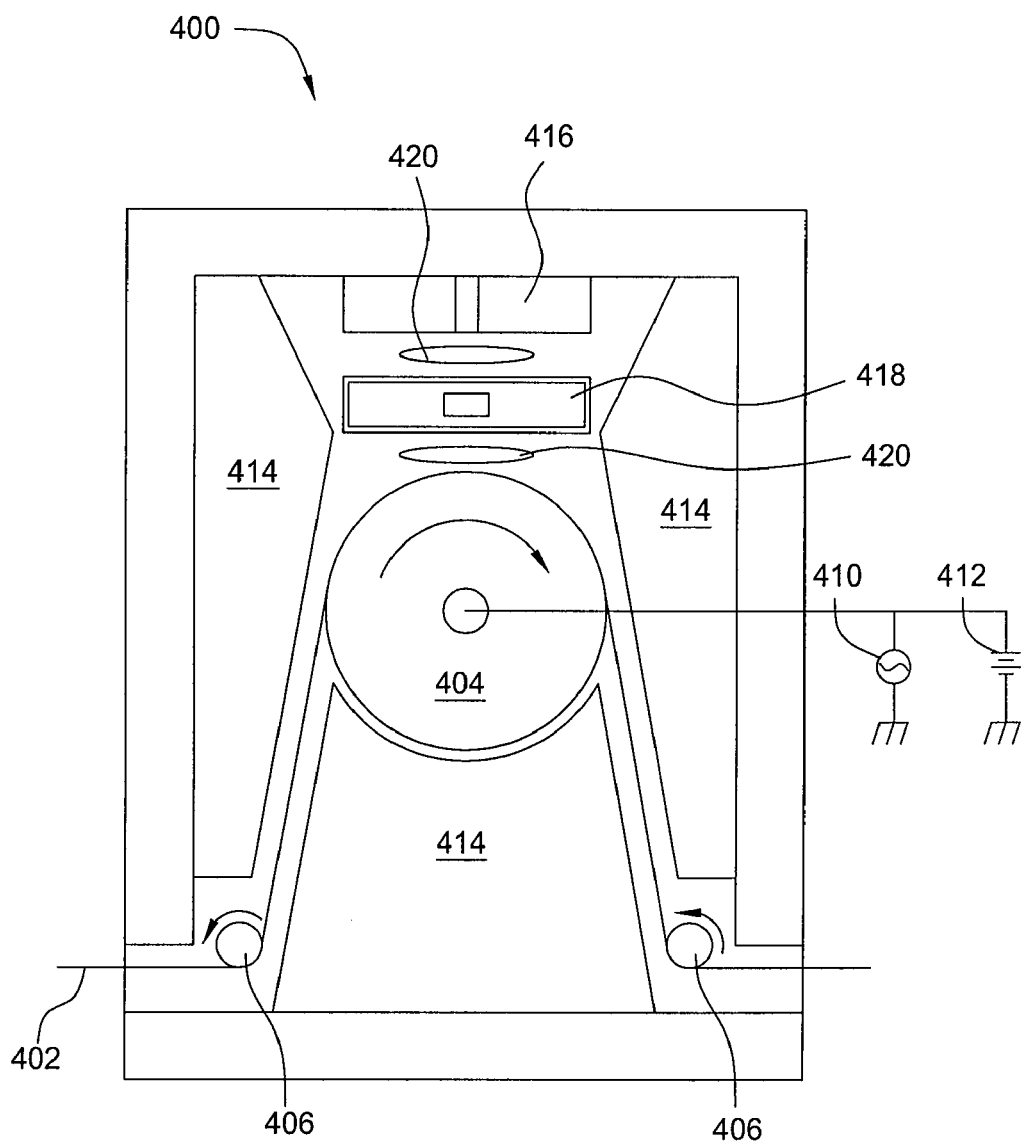
FIG. 4A is a cross sectional view of a processing chamber 400 according to another embodiment of the invention.
Figure 4B:
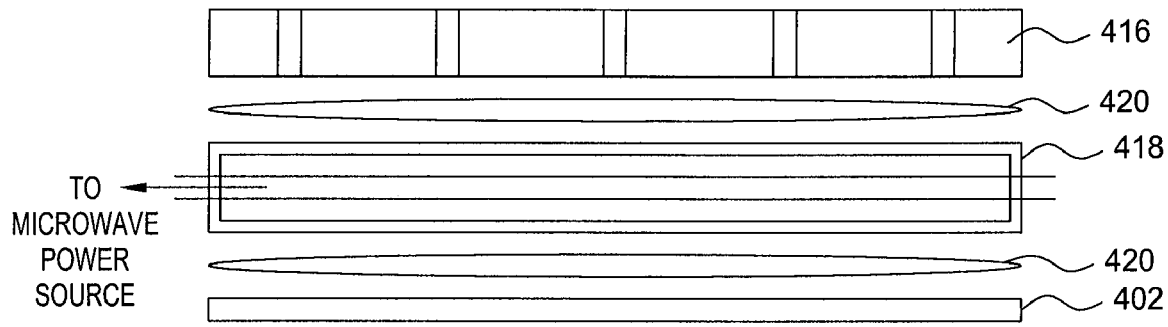
FIG. 4B is a side cross sectional view of a portion of the processing chamber 400 of FIG. 4A.

FIG. 4A is a cross sectional view of a processing chamber 400 according to another embodiment of the invention. FIG. 4B is a side cross sectional view of a portion of the processing chamber 400 of FIG. 4A. The substrate 402 enters the chamber 400 and passes over one or more rollers 406 as well as the outside surface of the rotating drum 404. The drum 404 rotates in a direction opposite to the rollers 406. Filler 414 is present within the chamber 414 as discussed above in regards to FIGS. 2A and 2B. The drum 404 may be electrically biased with current from one or more power sources 410, 412. The power sources 410, 412 may comprise switched-DC, AC, or DC power. The plasma 420 may be ignited in the chamber 400 by a microwave source 418. Gas may be fed into the chamber 400 from a gas manifold 416. The electrical bias on the substrate 402 at the drum 404 may pull the plasma 420 to the substrate 402 for deposition.

Depositing material onto a moving substrate for OLED deposition may be performed by igniting a plasma remote from the substrate and electrically biasing the substrate as it rolls past the plasma. In so doing, the plasma may be pulled to the substrate for deposition to occur. Thus, the substrate only pulls the amount of plasma that is necessary to deposit a layer thereon and is not overexposed to the plasma.

While the foregoing is directed to embodiments of the present invention, other and further embodiments of the invention may be devised without departing from the basic scope thereof, and the scope thereof is determined by the claims that follow.

The invention claimed is:

1. An apparatus, comprising:
a substrate processing chamber having a plurality of walls;
one or more rotatable process drums disposed within the chamber;
a plurality of filler blocks disposed within the substrate processing chamber and spaced thereapart to permit a substrate to pass therebetween while the substrate passes through the substrate processing chamber; and
one or more plasma sources coupled with the processing chamber, the plasma source comprises:
  a plasma tube coupled to one or more of the plurality of chamber walls, wherein the plasma tube further comprises two arm portions that extend from a central body, wherein ends of each arm are coupled within the chamber walls; and
  means for creating an inductively-coupled plasma, the means for creating an inductively-coupled plasma inside the tube comprises:
   one or more ferrite blocks substantially encircling the plasma tube; and
   one or more drive coils substantially encircling the one or more ferrite blocks.

2. The apparatus of claim 1, wherein a distance between a substrate that passes through the processing chamber and the plurality filler blocks is less than a plasma dark space.

3. The apparatus of claim 2, wherein the plurality filler blocks and the one or more rotatable process drums collectively comprise about 90% of the processing chamber volume.

4. The apparatus of claim 3, wherein no filler blocks are disposed within a line of sight path between the one or more rotatable process drums and the one or more plasma sources.

5. A web-processing apparatus, comprising:
a substrate processing chamber; and
one or more plasma sources coupled with the processing chamber and capable of igniting a substantially linear plasma, the plasma source comprises:
  a plasma tube coupled to the processing chamber, wherein the plasma tube further comprises two arm portions that extend from a central body, wherein ends of each arm are coupled within the processing chamber;
  one or more ferrite blocks substantially encircling the plasma tube; and
  one or more drive coils substantially encircling the one or more ferrite blocks.

6. The apparatus of claim 5, further comprising an RF power source coupled with the one or more drive coils.

7. The apparatus of claim 6, wherein the one or more drive coils comprise a multi-turn coil.

8. The apparatus of claim 5, further comprising a roll-to-roll substrate transport system.

* * * * *